(12) United States Patent
Wang et al.

(10) Patent No.: US 11,367,853 B2
(45) Date of Patent: Jun. 21, 2022

(54) OLED DISPLAY PANEL, PREPARATION METHOD THEREOF AND OLED DISPLAY DEVICE

(71) Applicants: Chengdu BOE Optoelectronics Technology Co., Ltd., Sichuan (CN); BOE Technology Group Co., Ltd., Beijing (CN)

(72) Inventors: Ge Wang, Beijing (CN); Zhiliang Jiang, Beijing (CN); Ting Wang, Beijing (CN); Zi Qiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 615 days.

(21) Appl. No.: 16/335,966

(22) PCT Filed: Sep. 18, 2018

(86) PCT No.: PCT/CN2018/106170
§ 371 (c)(1),
(2) Date: Mar. 22, 2019

(87) PCT Pub. No.: WO2019/105104
PCT Pub. Date: Jun. 6, 2019

(65) Prior Publication Data
US 2021/0359252 A1   Nov. 18, 2021

(30) Foreign Application Priority Data

Nov. 30, 2017   (CN) .......................... 201711240850.9

(51) Int. Cl.
*H01L 29/08*    (2006.01)
*H01L 51/52*    (2006.01)
*H01L 51/56*    (2006.01)

(52) U.S. Cl.
CPC ...... *H01L 51/5246* (2013.01); *H01L 51/5253* (2013.01); *H01L 51/56* (2013.01)

(58) Field of Classification Search
None
See application file for complete search history.

(56) References Cited

U.S. PATENT DOCUMENTS

| 9,634,287 B1 | 4/2017 | Shin |
| 2015/0228927 A1* | 8/2015 | Kim .................... H01L 27/3276 257/40 |

(Continued)

FOREIGN PATENT DOCUMENTS

| CN | 106601781 A | 4/2017 |
| CN | 106981584 A | 7/2017 |

(Continued)

OTHER PUBLICATIONS

International Search Report; Application No. PCT/CN2018/106170; dated Dec. 20, 2018; English Translation Attached.

(Continued)

*Primary Examiner* — Hung K Vu
(74) *Attorney, Agent, or Firm* — Nath, Goldberg & Meyer; Joshua B. Goldberg

(57) ABSTRACT

The present disclosure provides an OLED display panel, a preparation method thereof and an OLED display device. By providing an uneven surface on a side of a first encapsulation layer away from the organic light-emitting function layer in a non-display area, the uneven surface of the first encapsulation layer can block the flow of the second encapsulation layer to a certain extent, so as to reduce the fluidity and the (Continued)

climbing distance of the edge of the second encapsulation layer, and increase the edge stress and the slope angle. Thereby the narrow frame design of the product is achieved, the thickness uniformity of the edge of the second encapsulation layer is improved, the Mura defect in the non-display area is avoided, and the encapsulation result is guaranteed.

16 Claims, 3 Drawing Sheets

(56) References Cited

U.S. PATENT DOCUMENTS

| | | |
|---|---|---|
| 2016/0093827 A1 | 3/2016 | Han |
| 2017/0069873 A1 | 3/2017 | Kim et al. |
| 2017/0244063 A1 | 8/2017 | Furuie |
| 2021/0226138 A1* | 7/2021 | Dong ................ H01L 51/5253 |

FOREIGN PATENT DOCUMENTS

| | | |
|---|---|---|
| CN | 107046105 A | 8/2017 |
| CN | 107146858 A | 9/2017 |
| CN | 107507931 A | 12/2017 |

OTHER PUBLICATIONS

Extended European Search Report dated Jul. 21, 2021 corresponding to application No. 18857377.8-1211.
First Office Action dated Oct. 1, 2021 for Indian application No. 201947033798 with English translation attachec.

* cited by examiner

OLED DISPLAY PANEL, PREPARATION METHOD THEREOF AND OLED DISPLAY DEVICE

This is a National Phase Application filed under 35 U.S.C. 371 as a national stage of PCT/CN2018/106170, filed on Sep. 18, 2018, an application claiming the benefit of Chinese Application No. 201711240850.9, filed on Nov. 30, 2017, the content of disclosure is hereby incorporated by reference in its entirety.

TECHNICAL FIELD

The present disclosure relates to the field of display technologies, and in particular, to an OLED display panel, a preparation method thereof and an OLED display device.

BACKGROUND

OLED (Organic Light-Emitting Diode) device has become a competitive and promising next-generation display technology due to advantages such as its all-solid-state structure, high brightness, full viewing angle, fast response, wide range of operating temperature, and flexible display. The organic luminescent materials and cathode materials used in OLED devices are particularly sensitive to water and oxygen, and too much moisture or excessive oxygen levels will affect the lifetime of OLED devices. In order to effectively block the influence of water and oxygen on the OLED device, the OLED device needs to be packaged. TFE (Thin Film Encapsulation Technology) has an excellent barrier effect to water and oxygen and can be used for flexible encapsulation. It has become the mainstream encapsulation technology for flexible OLED display panel.

SUMMARY

The present disclosure provides an OLED display panel comprising a base substrate and a planarization layer, an organic light-emitting function layer, a first encapsulation layer and a second encapsulation layer sequentially formed on the base substrate, the first encapsulation layer is an inorganic layer, the second encapsulation layer is an organic layer; wherein in a non-display area of the OLED display panel, a side of the first encapsulation layer away from the organic light-emitting function layer has an uneven surface; and the second encapsulation layer covers the first encapsulation layer in a display area of the OLED display panel and a portion of the uneven surface that is adjacent to the display area.

Alternatively, a side of the planarization layer away from the base substrate has a concave-convex structure, the concave-convex structure is in the non-display area of the OLED display panel, and the concave-convex structure corresponds to the uneven surface.

Further, the OLED display panel comprises a first barrier wall, wherein the first barrier wall is on a side of the uneven surface away from the display area, and between the organic light-emitting function layer and the first encapsulation layer.

Further, the OLED display panel comprises a second barrier wall, wherein the second barrier wall is between the organic light-emitting function layer and the first encapsulation layer, and on a side of the first barrier wall away from the display area, a height of the second barrier wall is greater than a height of the first barrier wall.

Further, the OLED display panel comprises a third encapsulation layer, wherein the third encapsulation layer covers the second encapsulation layer and a portion of the first encapsulation layer that is not covered by the second encapsulation layer.

Alternatively, the concave-convex structure comprises a plurality of convex portions, and concave portions are formed between the adjacent convex portions.

Alternatively, each of the convex portions has the same shape.

Alternatively, each of the convex portions is connected to each other.

Alternatively, the convex portions are zigzag.

Alternatively, the convex portions are zigzag with an isosceles triangle or a right triangle.

Alternatively, each of the convex portions is disposed to be spaced apart from each other.

Alternatively, the convex portions are rectangular or trapezoidal.

The present disclosure also provides an OLED display device comprising the OLED display panel described above.

The present disclosure also provides a preparation method for OLED display panel, and the preparation method is used to prepare the OLED display panel described above.

Alternatively, the preparation method comprises: forming a planarization layer on a base substrate, and forming a pattern of a concave-convex structure on a side of the planarization layer away from the base substrate by a patterning process, the pattern of the concave-convex structure being in a non-display area of the OLED display panel; forming an organic light-emitting function layer, a first encapsulation layer, and a second encapsulation layer sequentially on the base substrate on which the planarization layer is formed; wherein the first encapsulation layer is an inorganic layer, and a position corresponding to the concave-convex structure on a side of the first encapsulation layer away from the organic light-emitting function layer is an uneven surface; the second encapsulation layer is an organic layer, and the second encapsulation layer covers the first encapsulation layer in a display area and a portion of the uneven surface that is adjacent to the display area.

Further, after forming the organic light-emitting function layer and before forming the first encapsulation layer, the preparation method further comprises: forming a first barrier wall and a second barrier wall by a patterning process in the non-display area, wherein the first barrier wall and the second barrier wall are on a side of the uneven surface away from the display area, the first barrier wall is adjacent to the display area than the second barrier wall, and a height of the second barrier wall is greater than a height of the first barrier wall.

Further, after forming the second encapsulation layer, the preparation method further comprises: forming a third encapsulation layer on the base substrate on which the first encapsulation layer and the second encapsulation layer are formed, wherein the third encapsulation layer covers the second encapsulation layer and a portion of the first encapsulation layer that is not covered by the second encapsulation layer.

DETAILED DESCRIPTION OF THE EMBODIMENTS

The technical solutions in the present disclosure will be clearly and completely described below in conjunction with the drawings in the present disclosure. It is apparent that the described embodiments are part of the embodiments of the present disclosure rather than all of them. All other embodiments obtained by a skilled person in the art based on the embodiments of the present disclosure without departing from the inventive scope are also within the scope of the disclosure.

Figure 2:
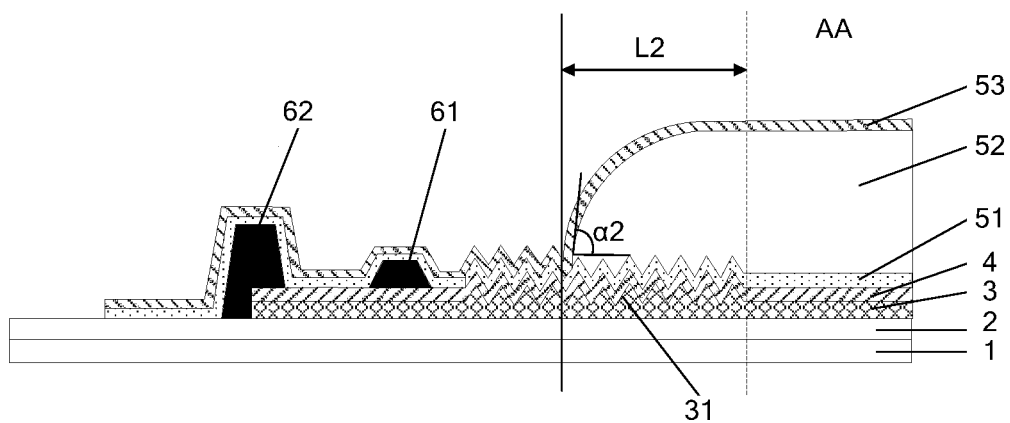
FIG. 2 is a schematic structural diagram of a non-display area of an OLED display panel provided by the present disclosure.

The present disclosure provides an OLED display panel, a preparation method thereof and an OLED display device, which are used to at least partially solve the problems that the fluidity of the organic second encapsulation layer is difficult to control, the climbing distance of the edge is large, and the thickness uniformity of the edge is poor during the encapsulation process of the OLED display panel. As shown in FIG. 2, the present disclosure provides an OLED display panel. The OLED display panel includes a base substrate 1 and back plate (BP) 2, a planarization layer (PVD) 3, an organic light-emitting function layer 4, a first encapsulation layer 51 and a second encapsulation layer 52 sequentially formed on the base substrate 1. The organic light-emitting function layer 4 may include an anode, a hole injection layer, a hole transport layer, a light-emitting layer, an electron transport layer, an electron injection layer, and a cathode. The material of the first encapsulation layer 51 is an inorganic material, which can be formed by a CVD (Chemical Vapor Deposition) method. The material of the second encapsulation layer 52 is an organic material, which can be formed by inkjet printing. In a non-display area of the OLED display panel, a side of the first encapsulation layer 51 away from the organic light-emitting function layer 4 has an uneven surface; and the second encapsulation layer 52 covers the first encapsulation layer in a display area of the OLED display panel and a portion of the uneven surface that is adjacent to the display area. As shown in FIG. 2, the left side of the dotted line is the non-display area of the OLED display panel, and the right side of the dotted line is the display area of the OLED display panel (i.e., the AA area). In the encapsulation operation of the OLED device, the second encapsulation layer 52 covers the entire display area and flows from the display area to the non-display area. In the non-display area, the second encapsulation layer 52 is blocked by the uneven surface of the first encapsulation layer 51. Herein, the uneven surface refers to a surface having a distinct concave-convex structure capable of blocking a liquid organic encapsulation layer from flowing through the entire uneven surface. Compared with the following problems that may occur in the conventional TFE process: "since the organic encapsulating layer is liquid before solidification, the fluidity is large, and it is difficult to precisely control its diffusion, so that the organic encapsulating layer is easy to flow out, resulting in poor sealing effect of the OLED display panel"; in the OLED display panel of the present disclosure, the uneven surface of the first encapsulation layer 51 can block the flow of the second encapsulation layer 52 to a certain extent and reduce its fluidity when forming the organic second encapsulation layer 52. Therefore, the OLED display panel of the present disclosure is easy to perform the encapsulation operation.

Figure 1A:
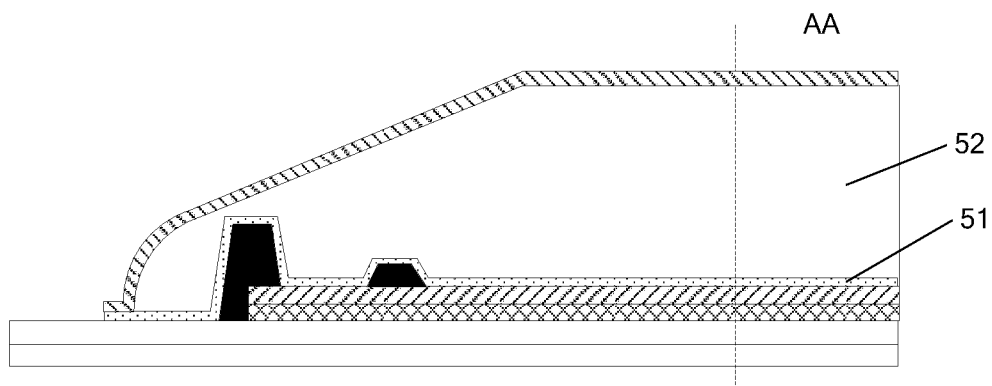
FIG. 1a is a schematic diagram showing the state of the encapsulant of the related OLED display panel.
Figure 1B:
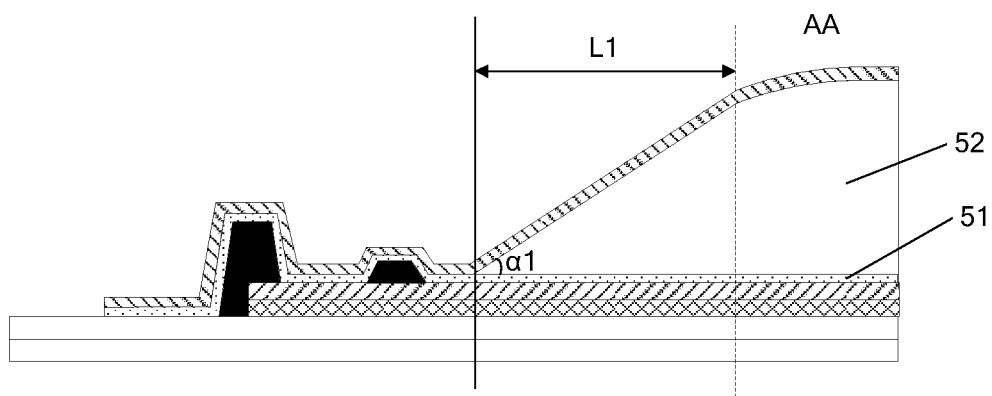
FIG. 1b is a schematic diagram showing the state of the encapsulant of the related OLED display panel.

Alternatively, a side of the planarization layer 3 away from the base substrate 1 may have a concave-convex structure 31, the concave-convex structure 31 is in the non-display area of the OLED display panel, and the concave-convex structure 31 corresponds to the uneven surface. In general, the planarization layer 3 has a greater thickness than the organic light-emitting function layer 4 and the first encapsulation layer 51. Therefore, providing a concave-convex structure on the planarization layer 3 is advantageous in obtaining an uneven surface having a large unevenness. Specifically, since the organic light-emitting function layer 4 is disposed on the planarization layer 3, and the first encapsulation layer 51 is disposed on the organic light-emitting function layer, a position corresponding to the concave-convex structure 31 on a side of the organic light-emitting function layer 4 away from the planarization layer 3 is an uneven surface; and a position corresponding to the concave-convex structure 31 on a side of the first encapsulation layer 51 away from the organic light-emitting function layer 4 is an uneven surface. The second encapsulation layer 52 covers the entire display area and flows from the display area to the non-display area. In the non-display area, the second encapsulation layer 52 is blocked by the uneven surface of the first encapsulation layer 51 formed by the concave-convex structure 31. As shown in FIG. 2, the slope angle of the edge of the second encapsulation layer 52 is $\alpha 2$, and the slope angle $\alpha 2$ of the edge of the second encapsulation layer 52 in the present disclosure is larger than the slope angle $\alpha 1$ of the edge of the second encapsulation layer 52 in the related structure (e.g., FIG. 1b). Correspondingly, the climbing distance L2 of the second encapsulation layer 52 is smaller than the climbing distance L1 of the second encapsulation layer 52 in the related structure as shown in FIG. 1b. The concave-convex structure 31 is provided on the side of the planarization layer 3 away from the base substrate 1 in the non-display area. After the organic light-emitting function layer 4 and the inorganic first encapsulation layer 51 are formed on the planarization layer 3, the positions of the organic light-emitting function layer 4 and the first encapsulation layer 51 corresponding to the concave-convex structure 31 are the uneven surfaces, that is, the positions of the organic light-emitting function layer 4 and the first encapsulation layer 51 corresponding to the concave-convex structure 31 also form a concave-convex structure with the same shape. When forming the organic second encapsulation layer 52, the uneven surface of the first encapsulation layer 51 can block the flow of the second encapsulation layer 52 to a certain extent, so as to reduce the fluidity and the climbing distance of the edge of the second encapsulation layer 52, and increase the edge stress and the slope angle. Thereby the narrow frame design of the product is achieved, the thickness uniformity of the edge of the second encapsulation layer 52 is improved, the Mura defect in the non-display area is avoided, and the encapsulation result is guaranteed.

It can be understood that the side of the organic light-emitting function layer 4 away from the planarization layer 3 may be disposed to have a concave-convex structure (not shown) in the non-display area in the case where the planarization layer 3 adopts an overall flat arrangement. Alternatively, in the case where the planarization layer 3 has the concave-convex structure in the non-display area, a portion of the organic light-emitting function layer 4 corresponding to the planarization layer 3 in the non-display area may be disposed to have a concave-convex structure (not shown) on the side of the organic light-emitting function layer 4 away from the planarization layer 3. The shape of the concave-convex structure of the organic light-emitting function layer 4 may be different from that of the concave-convex structure of the planarization layer 3 as long as the two can be attached to each other. In the above, such an uneven surface can be realized, which can block the flow of the second encapsulation layer 52 to a certain extent and reduce its fluidity.

Further, as shown in FIG. 2, the OLED display panel also includes a first barrier wall 61. The first barrier wall 61 is on a side of the uneven surface away from the display area, and between the organic light-emitting function layer 4 and the first encapsulation layer 51. That is, the uneven surface is located on a side of the first barrier wall 61 adjacent to the display area. Since the second encapsulation layer 52 covers only a part of the uneven surface adjacent to the display area, the second encapsulation layer 52 does not flow out of the first barrier wall 61, thereby ensuring the sealing effect of the OLED display panel.

Further, in order to ensure the sealing effect of the OLED display panel, as shown in FIG. 2, the OLED display panel may also include a second barrier wall 62. The second barrier wall 62 is between the organic light-emitting function layer 4 and the first encapsulation layer 51, and on a side of the first barrier wall 61 away from the display area. That is, the second barrier wall 62 is closer to the edge of the OLED display panel than the first barrier wall 61. A height of the second barrier wall 62 is greater than a height of the first barrier wall 61. Thus, even if the second encapsulation layer 52 flows out of the first barrier wall 61, it would be blocked by the second barrier wall 62, thereby ensuring the encapsulation effect.

Further, as shown in FIG. 2, the OLED display panel may also include a third encapsulation layer 53. The third encapsulation layer 53 is formed on the first encapsulation layer 51 and the second encapsulation layer 52, and covers the second encapsulation layer 52 and a portion of the first encapsulation layer 51 that is not covered by the second encapsulation layer 52. That is, the third encapsulation layer 53 is directly disposed on the second encapsulation layer 52 in the regions of the uneven surface adjacent to the display area and the display area. In the other non-display area except the above region of the uneven surface, since the second encapsulation layer 52 is absent, the third encapsulation layer 53 is directly disposed on the first encapsulation layer 51. Thus, the third encapsulation layer 53, the second encapsulation layer 52 and the first encapsulation layer 51 together implement encapsulation of the OLED display panel.

The specific structure of the concave-convex structure 31 will be described in detail below with reference to FIGS. 3a to 3d.

As shown in FIGS. 3a-3d, the concave-convex structure 31 includes a plurality of convex portions 311, and concave portions 312 are formed between the adjacent convex portions 311. The concave-convex structure 31 can be formed by a photolithography process by means of a mask.

Alternatively, each of the convex portions 311 has the same shape.

In the embodiment of the present disclosure, each of the convex portions 311 and each of the concave portions 312 have the same shape. It should be noted that the shape of each convex portion 311 and each concave portion 312 may also be different, as long as the surface of the planarization layer 3 away from the base substrate 1 is an uneven surface (concave-convex structure) and the uneven surface can ensure that the surface of the first encapsulation layer 51 away from the base substrate 1 is still an uneven surface after the completion of the preparation of the organic light-emitting layer 4 and the first encapsulation layer 51.

Figure 3A:
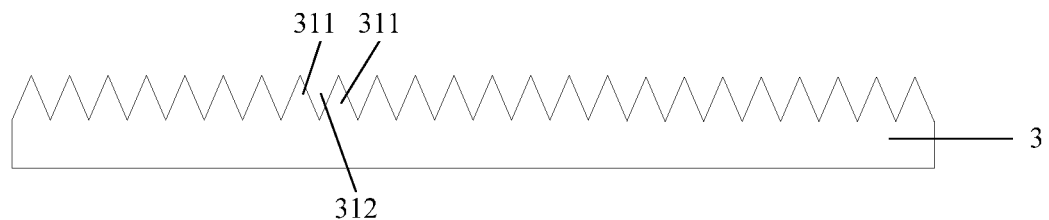
FIGS. 3a-3d are schematic diagrams of a concave-convex structure provided by the present disclosure.
Figure 3B:
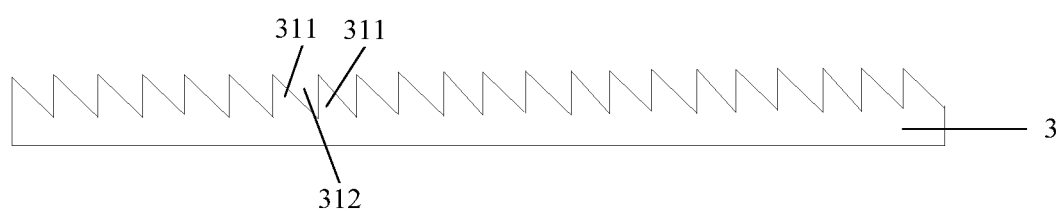

Referring to FIGS. 3a and 3b, each of the convex portions 311 may be connected to each other. Alternatively, each convex portion 311 and concave portion 312 may have a zigzag shape. As shown in FIG. 3a, each convex portion 311 and concave portion 312 may have a zigzag shape with an isosceles triangle. As shown in FIG. 3b, each convex portion 311 and concave portion 312 may also have a zigzag shape with a right triangle.

Figure 3C:
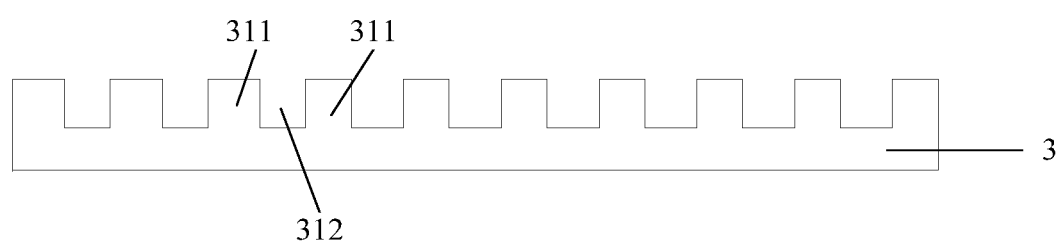
Figure 3D:
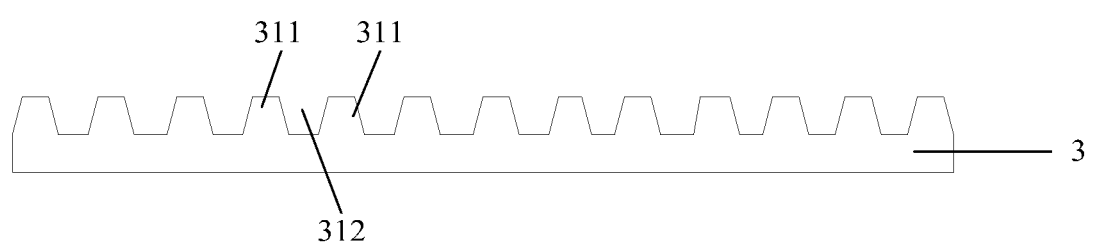

Referring to FIGS. 3c and 3d, each convex portion 311 may also be spaced apart from each other. As shown in FIG. 3c, each convex portion 311 and each concave portion 312 may be rectangular. As shown in FIG. 3d, each convex portion 311 and each concave portion 312 may be trapezoidal.

It should be noted that the specific shapes of the convex portion 311 and the concave portion 312 in the embodiment of the present disclosure are merely illustrative examples, and it is known to those skilled in the art that the convex portion 311 and the concave portion 312 are not limited to the above shapes.

If the second encapsulation layer 52 flows out of the first barrier wall 61 and the second barrier wall 62, the third encapsulation layer 53 is difficult to effectively wrap the second encapsulation layer 52. The water and oxygen in the external environment easily enter the inside of the display device, which may result in corroding the organic light-emitting layer 4 and causing dark spots of the display.

In the present disclosure, a concave-convex structure 31 is formed on the upper surface of the planarization layer 3 in the non-display area, so that the surfaces of the organic light-emitting layer 4 and the inorganic first encapsulation layer 51 located on the planarization layer 3 form corresponding concave-convex structures (i.e., uneven surface), respectively. After printing the material of the organic second encapsulation layer 52 on the uneven surface, such uneven surface can slow the flow rate of the material of the second encapsulation layer 52 and prevent it from flowing through the barrier walls. Thereby, the slope angle of the edge of the second encapsulation layer 52 is increased and the thickness uniformity of the second encapsulation layer 52 is maintained. This can solve the dark spot problem caused by the leakage of the second encapsulation layer 52 which is easy to occur in the conventional TFE encapsulation and the Mura defect problem caused by the poor uniformity of the film layers in the non-display area.

The present disclosure also provides an OLED display device including the OLED display panel described above.

The OLED display device may be any product or component having a liquid crystal display function, such as an electronic paper, a mobile phone, a tablet computer, a television, a digital photo frame, or the like.

The OLED display device of the present disclosure is provided with a concave-convex structure 31 on a side of the planarization layer 3 away from the base substrate 1 in the non-display area. After the organic light-emitting function layer 4 and the inorganic first encapsulation layer 51 are formed on the planarization layer 3, the positions of the organic light-emitting function layer 4 and the first encapsulation layer 51 corresponding to the concave-convex structure 31 are the uneven surfaces, that is, the positions of the organic light-emitting function layer 4 and the first encapsulation layer 51 corresponding to the concave-convex structure 31 also form a concave-convex structure with the same shape. When forming the organic second encapsulation layer 52, the uneven surface of the first encapsulation layer 51 can block the flow of the second encapsulation layer 52 to a certain extent, so as to reduce the fluidity and the climbing distance of the edge of the second encapsulation layer 52, and increase the edge stress and the slope angle. Thereby the narrow frame design of the product is achieved, the thickness uniformity of the edge of the second encapsulation layer 52 is improved, the Mura defect in the non-display area is avoided, and the encapsulation result is guaranteed.

The present disclosure also provides a preparation method for OLED display panel; such preparation method is used to prepare the OLED display panel as described above. An embodiment of the preparation method for OLED display panel will be described below with reference to FIGS. 2, 3a-3d and 4. The method may include the following steps: Step 101, forming a planarization layer 3 on a base substrate 1, and forming a pattern of a concave-convex structure 31 on a side of the planarization layer 3 away from the base substrate 1 by a patterning process.

Specifically, the pattern of the concave-convex structure 31 is in a non-display area of the OLED display panel. The specific structure of the concave-convex structure 31 may be as shown in FIGS. 3a to 3d, and details are not described herein.

Step 102, forming an organic light-emitting function layer 4, a first encapsulation layer 51, and a second encapsulation layer 52 sequentially on the base substrate 1 on which the planarization layer 3 is formed.

Specifically, the first encapsulation layer 51 is an inorganic layer, and a position corresponding to the concave-convex structure 31 on a side of the first encapsulation layer 51 away from the organic light-emitting function layer 4 is an uneven surface. The second encapsulation layer 52 is an organic layer, and the second encapsulation layer 52 covers the first encapsulation layer 51 in a display area and a portion of the uneven surface that is adjacent to the display area.

It should be noted that, after forming the organic light-emitting function layer 4 and before forming the first encapsulation layer 51, the preparation method further includes the following steps:

Forming a first barrier wall 61 and a second barrier wall 62 by a patterning process in the non-display area. The first barrier wall 61 and the second barrier wall 62 are on a side of the uneven surface away from the display area, and provided between the organic light-emitting function layer 4 and the first encapsulation layer 51. The first barrier wall 61 is adjacent to the display area than the second barrier wall 62, and a height of the second barrier wall 62 is greater than a height of the first barrier wall 61.

As can be seen by the Steps 101-102, the preparation method for OLED display panel of the present embodiment is provided with a concave-convex structure 31 on a side of the planarization layer 3 away from the base substrate 1 in the non-display area. After the organic light-emitting function layer 4 and the inorganic first encapsulation layer 51 are formed on the planarization layer 3, the positions of the organic light-emitting function layer 4 and the first encapsulation layer 51 corresponding to the concave-convex structure 31 are the uneven surfaces, that is, the positions of the organic light-emitting function layer 4 and the first encapsulation layer 51 corresponding to the concave-convex structure 31 also form a concave-convex structure with the same shape. When forming the organic second encapsulation layer 52, the uneven surface of the first encapsulation layer 51 can block the flow of the second encapsulation layer 52 to a certain extent, so as to reduce the fluidity and the climbing distance of the edge of the second encapsulation layer 52, and increase the edge stress and the slope angle. Thereby the narrow frame design of the product is achieved, the thickness uniformity of the edge of the second encapsulation layer 52 is improved, the Mura defect in the non-display area is avoided, and the encapsulation result is guaranteed. In the preparation method of the present embodiment, the existing mask can be modified without increasing any patterning process, and the preparation process is kept unchanged and easy to implement.

Figure 4:
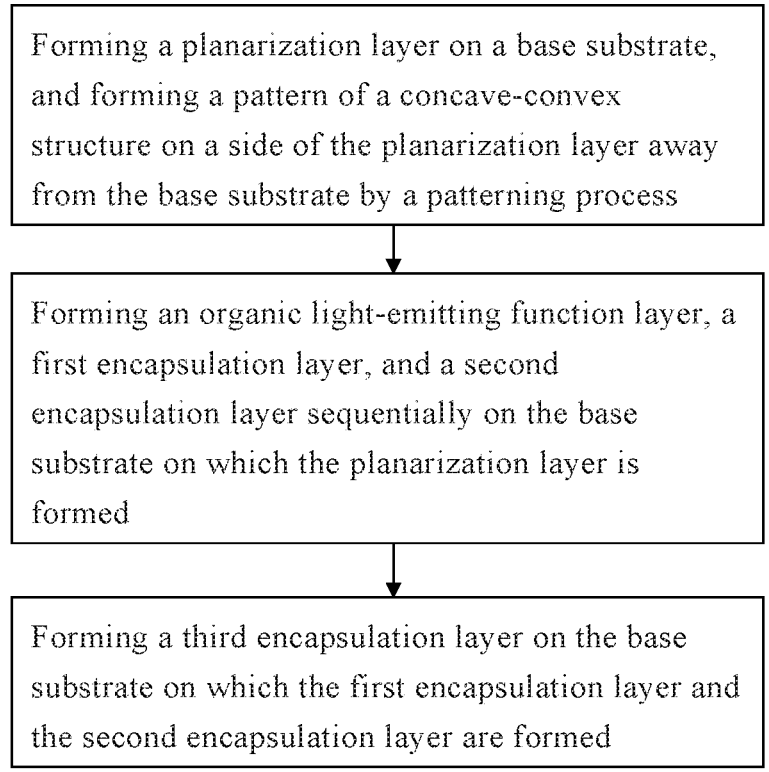
FIG. 4 is a flow chart of preparing an OLED display panel provided by the present disclosure.

Further, as shown in FIG. 4, after forming the second encapsulation layer 52 (i.e. Step 102), the preparation method further includes the following steps: Step 103, forming a third encapsulation layer 53 on the base substrate 1 on which the first encapsulation layer 51 and the second encapsulation layer 52 are formed.

Specifically, the third encapsulation layer 53 covers the second encapsulation layer 52 and a portion of the first encapsulation layer 51 that is not covered by the second encapsulation layer 52.

It can be understood that the side of the organic light-emitting function layer 4 away from the planarization layer 3 may be disposed to have a concave-convex structure in the non-display area in the case where the planarization layer 3 adopts an overall flat arrangement. Alternatively, in the case where the planarization layer 3 has the concave-convex structure in the non-display area, a portion of the organic light-emitting function layer 4 corresponding to the planarization layer 3 in the non-display area may be disposed to have a concave-convex structure on the side of the organic light-emitting function layer 4 away from the planarization layer 3. The shape of the concave-convex structure of the organic light-emitting function layer 4 may be different from that of the concave-convex structure of the planarization layer 3 as long as the two can be attached to each other. Similar to the formation of the concave-convex structure on the planarization layer 3, a concave-convex structure can be formed on the organic light-emitting function layer 4 by a patterning process. In the above, such an uneven surface can be realized, which can block the flow of the second encapsulation layer 52 to a certain extent and reduce its fluidity.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

What is claimed is:

1. An OLED display panel, comprising a base substrate and a planarization layer, an organic light-emitting function layer, a first encapsulation layer and a second encapsulation layer sequentially formed on the base substrate, the first encapsulation layer is an inorganic layer, the second encapsulation layer is an organic layer; wherein in a non-display area of the OLED display panel, a side of the first encapsulation layer away from the organic light-emitting function layer has an uneven surface; and the second encapsulation layer covers the first encapsulation layer in a display area of the OLED display panel and a portion of the uneven surface that is adjacent to the display area the OLED display panel further comprises a third encapsulation layer, wherein the third encapsulation laser directly contacts the second encapsulation layer and a portion of the first encapsulation layer that is net covered by the second encapsulation layer, wherein the portion of the first encapsulation layer that is not covered by the second encapsulation layer corresponds to the remainder of the uneven surface that is not covered by the second encapsulation layer.

2. The OLED display panel of claim 1, wherein a side of the planarization layer away from the base substrate has a concave-convex structure, the concave-convex structure is in the non-display area of the OLED display panel, and the concave-convex structure corresponds to the uneven surface.

3. The OLED display panel of claim 1, further comprising a first barrier wall, wherein the first barrier wall is on a side of the uneven surface away from the display area, and between the organic light-emitting function layer and the first encapsulation layer.

4. The OLED display panel of claim 3, further comprising a second barrier wall, wherein the second barrier wall is between the organic light-emitting function layer and the first encapsulation layer, and on a side of the first barrier wall away from the display area, a height of the second barrier wall is greater than a height of the first barrier wall.

5. The OLED display panel of claim 1, wherein the concave-convex structure comprises a plurality of convex portions, and concave portions are formed between the adjacent convex portions.

6. The OLED display panel of claim 5, wherein each of the convex portions has the same shape.

7. The OLED display panel of claim 5, wherein each of the convex portions is connected to each other.

8. The OLED display panel of claim 7, wherein the convex portions are zigzag.

9. The OLED display panel of claim 8, wherein the convex portions are zigzag with an isosceles triangle or a right triangle.

10. The OLED display panel of claim 5, wherein each of the convex portions is disposed to be spaced apart from each other.

11. The OLED display panel of claim 10, wherein the convex portions are rectangular or trapezoidal.

12. An OLED display device comprising the OLED display panel of claim 1.

13. A preparation method for OLED display panel, wherein the preparation method is used to prepare the OLED display panel of claim 1.

14. The preparation method for OLED display panel of claim 13, wherein the preparation method comprises:
    forming a planarization layer on a base substrate, and forming a pattern of a concave-convex structure on a side of the planarization layer away from the base substrate by a patterning process, the pattern of the concave-convex structure being in a non-display area of the OLED display panel;
    forming an organic light-emitting function layer, a first encapsulation layer, and a second encapsulation layer sequentially on the base substrate on which the planarization layer is formed; wherein the first encapsulation layer is an inorganic layer, and a position corresponding to the concave-convex structure on a side of the first encapsulation layer away from the organic light-emitting function layer is an uneven surface; the second encapsulation layer is an organic layer, and the second encapsulation layer covers the first encapsulation layer in a display area and a portion of the uneven surface that is adjacent to the display area.

15. The preparation method for OLED display panel of claim 14, after forming the organic light-emitting function layer and before forming the first encapsulation layer, the preparation method further comprising:
    forming a first barrier wall and a second barrier wall by a patterning process in the non-display area, wherein the first barrier wall and the second barrier wall are on a side of the uneven surface away from the display area, the first barrier wall is adjacent to the display area than the second barrier wall, and a height of the second barrier wall is greater than a height of the first barrier wall.

16. The preparation method for OLED display panel of claim 14, after forming the second encapsulation layer, the preparation method further comprising:
    forming a third encapsulation layer on the base substrate on which the first encapsulation layer and the second encapsulation layer are formed, wherein the third encapsulation layer covers the second encapsulation layer and a portion of the first encapsulation layer that is not covered by the second encapsulation layer.

* * * * *